United States Patent
Jiang et al.

(10) Patent No.: US 9,881,764 B2
(45) Date of Patent: Jan. 30, 2018

(54) HEAT-SPREADING BLANKING SYSTEM FOR HIGH THROUGHPUT ELECTRON BEAM APPARATUS

(71) Applicant: KLA-Tencor Corporation, Milpitas, CA (US)

(72) Inventors: Xinrong Jiang, Palo Alto, CA (US); Christopher Sears, San Jose, CA (US); Douglas Larson, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/255,314

(22) Filed: Sep. 2, 2016

(65) Prior Publication Data
US 2017/0200581 A1    Jul. 13, 2017

Related U.S. Application Data

(60) Provisional application No. 62/276,824, filed on Jan. 9, 2016.

(51) Int. Cl.
*H01J 37/26* (2006.01)
*G21K 5/04* (2006.01)
*H01J 37/04* (2006.01)
*H01J 37/21* (2006.01)
*H01J 37/147* (2006.01)

(52) U.S. Cl.
CPC .......... *H01J 37/045* (2013.01); *H01J 37/147* (2013.01); *H01J 37/21* (2013.01); *H01J 2237/0451* (2013.01); *H01J 2237/0492* (2013.01)

(58) Field of Classification Search
CPC ...... H01J 37/153; H01J 37/3174; H01J 37/12; H01J 37/045; H01J 37/244; H01J 37/304; H01J 2237/24507; H01J 2237/2443
USPC .............................................. 250/396 R, 397
See application file for complete search history.

(56) References Cited

U.S. PATENT DOCUMENTS

| | | | |
|---|---|---|---|
| 6,483,117 B1 | 11/2002 | Clement et al. | |
| 6,521,896 B1 | 2/2003 | DeVore et al. | |
| 7,728,308 B2 | 6/2010 | Zhang | |
| 9,269,542 B2* | 2/2016 | Sinclair | H01J 37/3177 |
| 2005/0121611 A1 | 6/2005 | Kimba et al. | |
| 2009/0114818 A1* | 5/2009 | Casares | H01J 37/045 250/307 |

(Continued)

FOREIGN PATENT DOCUMENTS

| | | |
|---|---|---|
| JP | S62170139 A | 7/1987 |
| JP | 2000251815 A | 9/2000 |

(Continued)

OTHER PUBLICATIONS

ISA/KR, International Search Report for PCT/US2017/012386 dated Apr. 18, 2017.

*Primary Examiner* — Nicole Ippolito
(74) *Attorney, Agent, or Firm* — Hodgson Russ LLP

(57) ABSTRACT

An electron beam apparatus addresses blanking issues resulting from sinking high-power heat onto an aperture diaphragm by evenly spreading heat on the aperture diaphragm. The apparatus can include an aperture diaphragm and a deflector that deflects the electron beam on the aperture diaphragm. The electron beam is directed at the aperture diaphragm in a pattern around the aperture. The pattern may be a circle, square, or polygon. The pattern also may include a variable locus relative to the aperture.

20 Claims, 13 Drawing Sheets

(56) References Cited

U.S. PATENT DOCUMENTS

| | | | |
|---|---|---|---|
| 2010/0072403 A1* | 3/2010 | Abe | B82Y 10/00 |
| | | | 250/492.22 |
| 2010/0148087 A1 | 6/2010 | Doering et al. | |
| 2015/0136979 A1 | 5/2015 | Tachibana et al. | |
| 2015/0200074 A1* | 7/2015 | Hamaguchi | H01J 37/3177 |
| | | | 250/396 R |

FOREIGN PATENT DOCUMENTS

| | | |
|---|---|---|
| JP | 2001345258 A | 12/2001 |
| JP | 2002217088 | 8/2002 |
| JP | 2005277046 A | 10/2005 |
| JP | 2006005133 A | 1/2006 |

\* cited by examiner

HEAT-SPREADING BLANKING SYSTEM FOR HIGH THROUGHPUT ELECTRON BEAM APPARATUS

CROSS-REFERENCE TO RELATED APPLICATIONS

This application claims priority to the provisional patent application filed Jan. 9, 2016 and assigned U.S. App. No. 62/276,824, the disclosure of which is hereby incorporated by reference.

FIELD OF THE DISCLOSURE

This disclosure relates to an electron beam apparatus.

BACKGROUND OF THE DISCLOSURE

Wafer inspection and metrology systems help a semiconductor manufacturer increase and maintain integrated circuit (IC) chip yields by detecting defects that occur during the manufacturing process. One purpose of inspection and metrology systems is to monitor whether a manufacturing process meets specifications. Inspection and metrology system can indicate the problem and/or the source of the problem if the manufacturing process is outside the scope of established norms, which the semiconductor manufacturer can then address.

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Electron beam systems are used for wafer inspection and metrology. During operation, an electron beam system can electrostatically deflect an uninterrupted beam of electrons away from the optical axis and, thus, "switch" the electron beam "on" and "off." This process is commonly referred to as "blanking." Blanking is typically faster than stopping and starting the electron beam. Beam blanking may be a required function in electron beam systems used in, for example, lithography, testing, metrology, and inspection.

Blanking systems typically deflect a high-power electron beam onto an aperture diaphragm to blank the electron beam and prevent an electron beam from reaching a wafer. The high-density electron beam dissipates into a large amount of narrowly-distributed heat at the aperture diaphragm. Such intense heat on the aperture diaphragm causes many problems, including distorting the aperture or aperture diaphragm, damaging the aperture or aperture diaphragm, or burning the aperture diaphragm. The resulting heat to the aperture diaphragm also can shift the aperture and cause dimensional errors in stitching exposure patterns of a shaped electron beam.

Semiconductor manufacturers are demanding increased integration density and device proximity. An efficient and straightforward approach to meet these requirements is to use higher electron beam currents and higher electron beam energies. However, this approach leads to a serious problem. A megawatt per square centimeter power density in a focused electron beam apparatus can damage an aperture or aperture diaphragm during blanking or can burn an aperture diaphragm during blanking. A kilowatt per square centimeter power density in a shaped electron beam apparatus can cause pattern-stitching errors of exposure due to the heat expansion effect of the aperture or aperture diaphragm. Pattern-stitching errors can occur when, for example, sub-patterns cannot be stitched together precisely enough to meet electron beam lithography requirements, which can lead to integrated circuit malfunctions. Distortion, shifting, tilting, expansion, or other changes in shape to the aperture or aperture diaphragm increase the chance of a pattern-stitching error.

FIG. 1 is a plan view of an aperture diaphragm 201 with blanking deflector plates 202. The deflector plates in the −x-axis and −y-axis can be grounded, so a pair of unipolar blanking voltages (or currents) are applied on the deflector plates 202 in +x-axis and +y-axis. The focused electron beam is deflected in the aperture plane from the center 0 to position A in FIG. 1. Parking a focused electron beam with megawatt power density at the position A of the aperture diaphragm 201 in FIG. 1 can damage and even burn the aperture diaphragm 201 locally. The aperture diaphragm 201 may also be shifted laterally due to the tensile stresses resulted from uneven heating and/or temperature distributions. To reduce the local heat at position A in FIG. 1, the blanking system voltages Vx and Vy can be used to scan the beam from B to B' back and forth at any polar angle θ, but the heat distribution is still rotationally asymmetrical around the aperture. The edge rim of the aperture diaphragm 201 can still be shifted, distorted, or damaged.

Therefore, what is needed is an improved electron beam apparatus and blanking technique.

BRIEF SUMMARY OF THE DISCLOSURE

In a first embodiment, an electron beam apparatus is provided. The electron beam apparatus comprises an aperture diaphragm defining an aperture through which an electron beam is projected; a lens configured to focus the electron beam toward the aperture; a deflector configured to deflect the electron beam on the aperture diaphragm; and a plurality of power supply modules. The deflector includes a plurality of plates. The power supply modules are configured to bias the plates such that the electron beam is directed at the aperture diaphragm in a pattern around an entirety of the aperture.

In an instance, the deflector includes at least eight of the plates. In another instance, the deflector includes four of the plates and the electron beam apparatus includes four of the power supply modules.

The electron beam apparatus can include a stage configured to hold a wafer in a path of the electron beam.

The electron beam apparatus of claim 1, wherein a focus of the electron beam is a distance from a center of the aperture.

The lens can be a gun lens and the electron beam apparatus can include a plate defining a beam limiting aperture; a condenser lens; and an objective lens.

The power supply modules can be configured to bias the plates such that the electron beam is directed at the aperture diaphragm and is continuously scanned around the aperture.

In a second embodiment, a method is provided. The method comprises directing an electron beam through an aperture. The aperture is defined by an aperture diaphragm. A deflector that includes a plurality of plates is disposed around the aperture diaphragm. At least one of the plates in the deflector is biased. The electron beam is deflected using the deflector such that the electron beam is directed at the aperture diaphragm in a pattern around an entirety of the aperture. The pattern can be a circle, a square, or a polygon. The pattern can have a variable locus relative to the aperture with a pattern that is a circle, square, or polygon.

In a third embodiment, an electron beam apparatus is provided. The electron beam apparatus comprises an aperture diaphragm defining an aperture through which an electron beam is projected; a lens configured to focus the electron beam toward the aperture; a deflector configured to deflect the electron beam on the aperture diaphragm; a plurality of power supply modules connected to the plates; and a controller that is programmed to control a bias to at least one of the plates whereby the electron beam is directed at the aperture diaphragm in a pattern around an entirety of the aperture. The deflector includes a plurality of plates.

The controller can be further programmed to control voltage of the power supply modules to bias at least one of the plates.

The controller can be further programmed to direct the electron beam in a circle, a square, or a polygon.

The controller can be further programmed to direct the electron beam to have a variable locus relative to the aperture.

In an instance, the deflector includes at least eight of the plates. In another instance, the deflector includes four of the plates and the electron beam apparatus includes four of the power supply modules.

The electron beam apparatus can include a stage configured to hold a wafer in a path of the electron beam.

The power supply modules can be configured to bias the plates such that the electron beam is directed at the aperture diaphragm and is continuously scanned around the aperture.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein provide a heat-spreading blanking system that addresses the problems stated above with circular, square, or polygonal blanking techniques in an electron beam apparatus. These techniques may be symmetric or may use a symmetric pattern. The embodiments disclosed herein provide solutions to the blanking issues resulting from sinking high-power heat onto the aperture diaphragm. Heat sinking on the aperture diaphragm can be spread out instantly and evenly. Throughput can be enhanced and resolution of an electron beam apparatus (either a focused electron beam or a shaped electron beam) can be improved. The throughput or resolution can be enhanced with increasing beam current or beam energy because the risk of damage to the aperture during blanking is reduced or removed. Embodiments disclosed herein can easily be implemented in existing systems.

Figure 1:
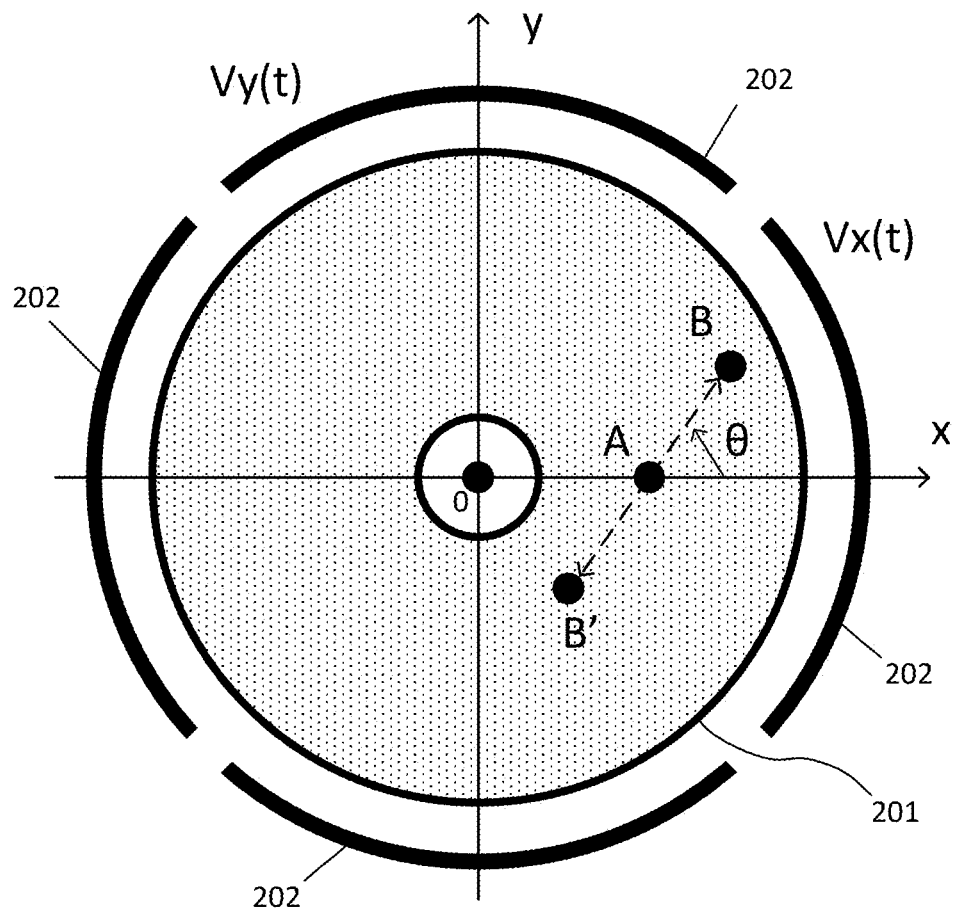
FIG. 1 is a plan view of an aperture diaphragm with blanking deflector plates.
Figure 2:
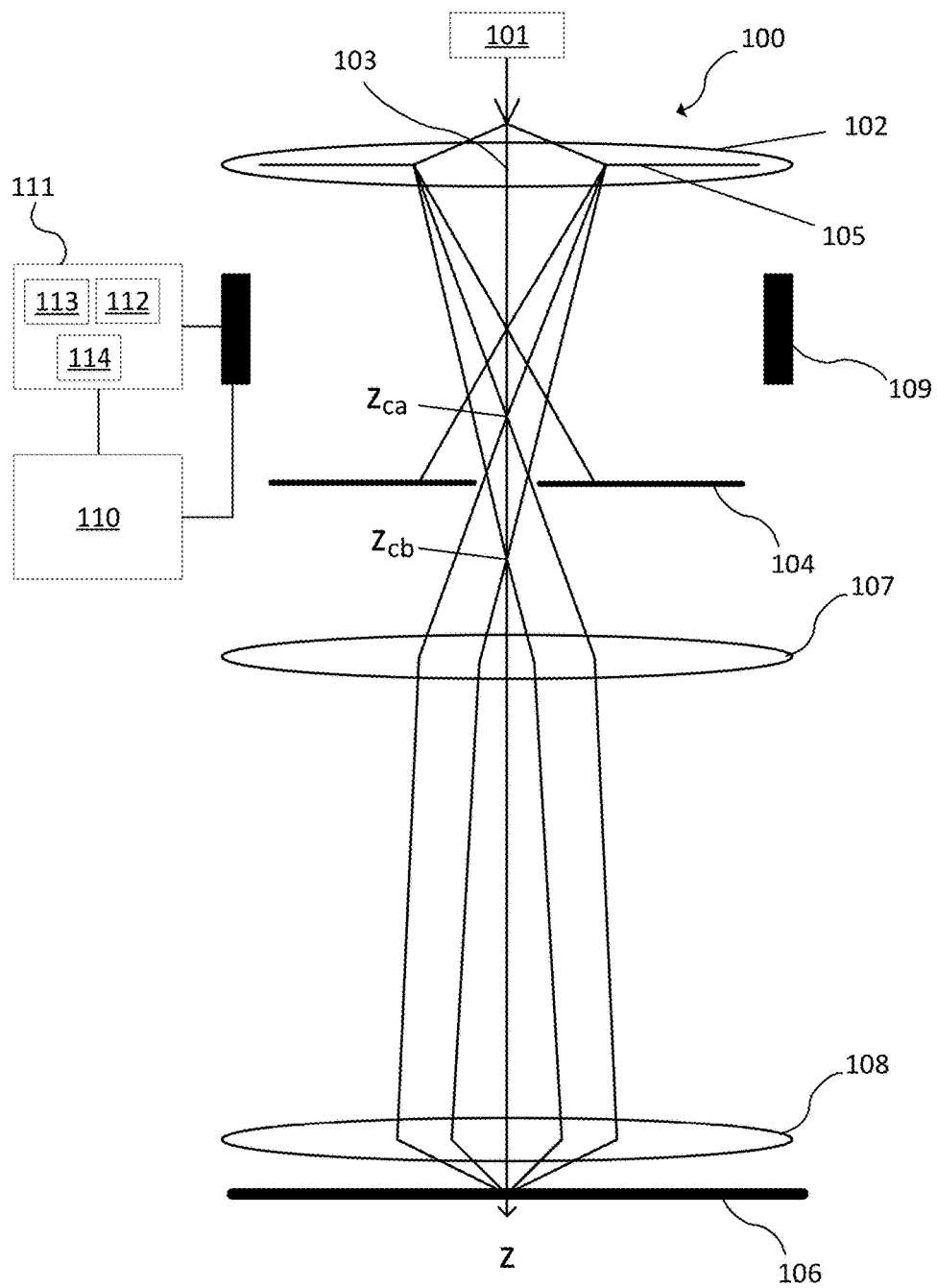
FIG. 2 is a cross-sectional diagram of optics in an electron beam apparatus with a blanking system.

FIG. 2 is a cross-sectional diagram of optics in an electron beam apparatus 100 with a blanking system. A lens, such as a gun lens 102, focuses the electron beam 103 from the emission tip of an electron source 101 toward a crossover around the aperture diaphragm 104. The maximum beam current is limited by the beam-limiting aperture 105, and the final beam current to the target (e.g., a semiconductor wafer 106) is further selected by the aperture diaphragm 104 by varying the gun lens 102 focusing strength. The condenser lens 107 and objective lens 108 focusing strengths can be optimized to select an optimal numerical aperture (NA) at which the electron beam 103 spot size at the target is minimized for highest resolution. The blanking deflector 109 deflects the electron beam 103 onto the aperture diaphragm 104 when the electron beam should be stopped from reaching the target (e.g., wafer 106).

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

The material of the aperture diaphragm 104 may be selected to further reduce the effects of blanking. For example, the material in the aperture diaphragm 104 may be burn-resistant, may have a high melting temperature, or may be selected to reduce shifting or distortion. In an instance, the aperture diaphragm 104 includes molybdenum or a molybdenum compound. In another instance, the aperture diaphragm 104 consists of or consists essential of molybdenum or a molybdenum compound. The aperture diaphragm 104 can have, for example, an aperture with a diameter from 10 μm to 100 μm for a focused electron beam. The aperture diaphragm 104 also can have a square aperture with a side length on the scale of, for example, one or more microns for a shaped electron beam.

While shown as a cross-section in FIG. 2, there may be multiple plates in the blanking deflector 109. In an example, there are four plates in the blanking deflector 109 arranged around the aperture diaphragm 104. More than four plates are possible in the blanking deflector 109. In another example, there are eight or more plates in the blanking deflector 109 arranged around the aperture diaphragm 104 in a manner similar to the four plates illustrated in FIG. 3. In yet another example, there are twelve or more plates in the blanking deflector 109 arranged around the aperture diaphragm 104 in a manner similar to the four plates illustrated in FIG. 3. More than four plates can provide a more homogenous deflection field, though four plates can provide a desired performance.

Each plate in the blanking defector 109 is connected to a power supply 110. Each plate may have an individual power supply or two or more of the plates may be connected to the same power supply. In an instance, all the plates are connected to the same power supply.

The electron beam apparatus 100 communicates with a controller 111. For example, the controller 111 can communicate with the blanking deflector 109, the power supply 110, or other components of the electron beam apparatus 100. The controller 111 can include a processor 112, a storage device 113 in electronic communication with the processor 112, and a communication port 114 in electronic communication with the processor 112. It is to be appreciated that the controller 111 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 111 to implement the various methods and functions described herein may be stored in controller readable storage media, such as a memory of the storage device 113, within the controller 111, external to the controller 111, or combinations thereof. The controller 111 may be coupled to components of the electron beam apparatus 100 in any suitable manner (e.g., via one or more transmission media, which may include "wired" and/or "wireless" transmission media) such that the controller 111 can receive the output generated by these components of the electron beam apparatus 100.

The controller 111 can control the pattern of the electron beam 103. For example, the controller 111 may perform the steps of FIG. 13 or control the electron beam to have the pattern of FIG. 3, 5, 9, or 11. The controller 111 also may perform other steps or techniques disclosed herein.

The controller 111, other system(s), or other subsystem(s) described herein may take various forms, including a personal computer system, image computer, mainframe computer system, workstation, network appliance, internet appliance, or other device. In general, the term "controller" may be broadly defined to encompass any device having one or more processors, which executes instructions from a memory medium. The subsystem(s) or system(s) may also include any suitable processor known in the art such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for controlling a pattern of the electron beam 103, as disclosed herein. In particular, as shown in FIG. 2, storage device 113 or other storage medium may contain non-transitory computer-readable medium that includes program instructions executable on the controller 111. The computer-implemented method may include any step(s) of any method(s) described herein.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Controller 111 may be configured according to any of the embodiments described herein. In an instance, the processor 112 is programmed to perform any of the methods described herein.

Electron beam 103 energy may be as high as 30 kV and electron beam 103 current may be as high as 100 nA. Power density in a crossover can be calculated by Equation 1.

$$q = (BE \times BC)/(0.25\pi d^2) \qquad \text{Eq. 1}$$

In Equation 1, BE is beam energy, BC is beam current, and d is the diameter of the beam spot. For example, the average power density inside a 150 nm electron beam spot is 17 MW/cm$^2$.

In selecting highest beam currents, the electron beam 103 crossover size around the aperture in FIG. 2 can be in a range from sub-microns to microns. For instance, in an operation of aperture calibration, the electron beam 103 may be focused in the aperture plane and scanned over the aperture edge. The focused spot size in the aperture plane can be around 0.1 microns or even smaller. In this case, the power density within the crossover is greater than 20 megawatts per square centimeter.

It may be desirable to avoid stopping electron beam 103 deflection during blanking that may concentrate the beam and possibly damage the blanking aperture structure. Accordingly, the electron beam 103 is kept in motion around the aperture of the aperture diaphragm 104 to spread the heat symmetrically. The blanking deflection pattern of the electron beam 103 can be a closed geometrical figure disposed symmetrically around the aperture. A moving locus with a symmetrical pattern may provide the best heat spreading and may be easiest to control, though other pattern configurations are possible. Besides preventing damage to the aperture diaphragm 104, this also may help provide sufficient throughput.

Using an embodiment disclosed herein, the blanking process can occur in, for example, 5 ns to 10 ns. During blanking, it may be desired to have less than ten electrons pass through the aperture of the aperture diaphragm 104 from a time when electron beam 103 blanking begins to when the electron beam 103 is blanked. Other speeds and thresholds are possible.

Damage to the aperture diaphragm may decrease the closer the electron beam is parked to the edge of the aperture bore (i.e., farther away from the aperture). However, this can increase blanking time or blanking voltage. The distance the electron beam is moved from the aperture during blanking, the blanking time, and/or the blanking voltage can be optimized for a particular application.

Figure 3:
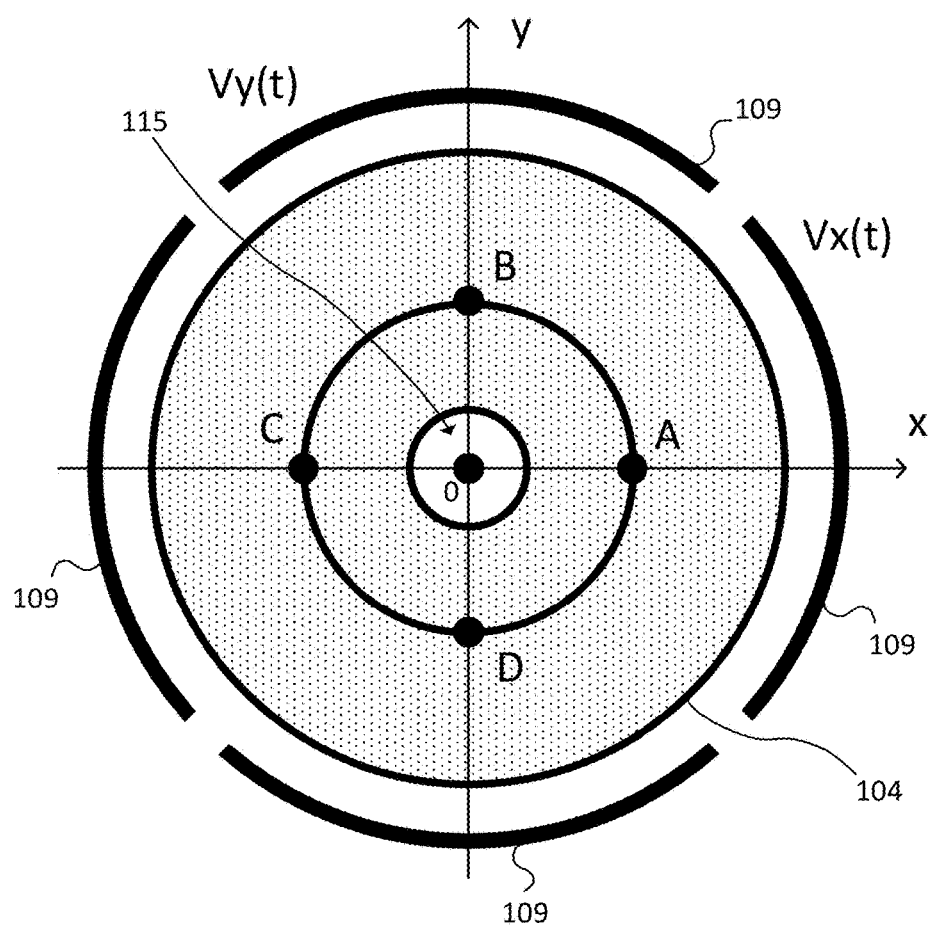
FIG. 3 is a plan view of an aperture diaphragm showing a unipolar blanking method with a circular electron locus.

FIG. 3 is a plan view of an aperture diaphragm 104 showing a unipolar blanking method with a circular electron locus. After the electron beam is deflected from position 0 in the aperture 115 to position A on the aperture diaphragm 104, the electron beam is continuously scanned in a circular locus A-B-C-D-A, such that the heat dissipation and temperature distribution are rotationally symmetric around the aperture 115. Thus, the heat tensile stresses due to the power dissipation are eliminated symmetrically and, consequently, the aperture shift and distortion are reduced or removed.

A circular electron locus for a focused electron beam spreads the heat rotationally symmetric, which is consistent with the aperture shape to avoid the distortion of aperture. Use of a circular locus that is rotationally symmetric with a round aperture may reduce temperature differences. Any damage to the aperture diaphragm 104 can be reduced or may be negligible.

While illustrated in FIG. 3 as a circle, two or more square apertures can used to form a shaped electron beam in a shaped electron beam projection apparatus. The power density of a shaped beam for high throughput is in the range of kilowatts per square centimeter over a region of hundreds of microns square. The dimensional stability of a square aperture may be important because an aperture shift error can directly result in stitching problems of the exposure patterns in, for instance, an electron beam lithography apparatus. The stitching error likely should not be larger than minimum feature sizes around hundreds of nanometers. However, if the heat dissipation on the aperture diaphragm is not spread instantly, the aperture shift due to the heat tensile stresses by a kilowatt power density electron beam can be as large as submicrons. A circular electron locus can be used with a square aperture.

Figure 4:
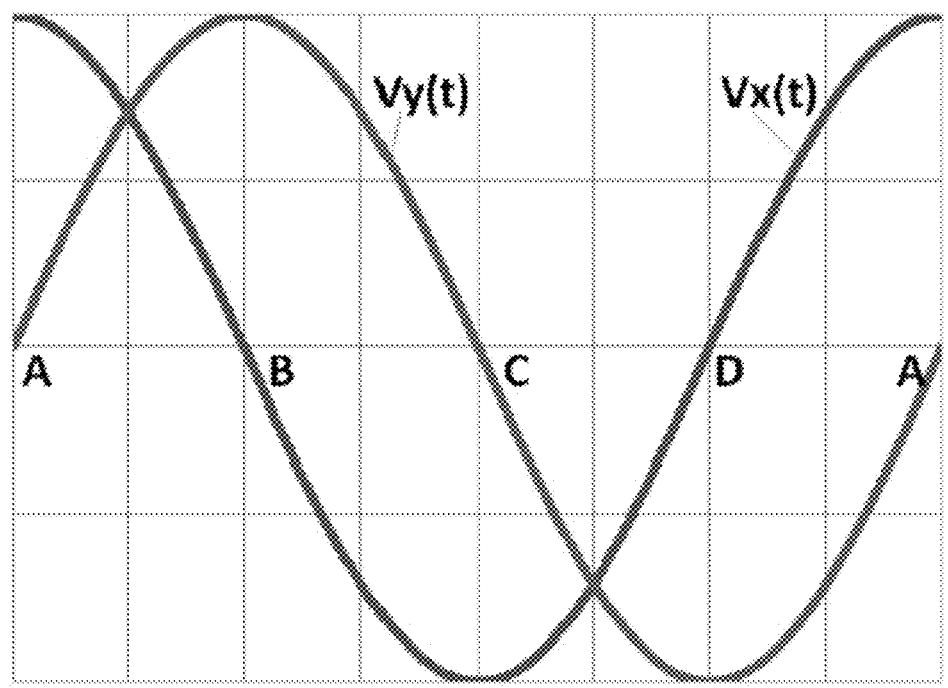
FIG. 4 is a chart showing blanking deflector voltage signals for the circular electron locus of FIG. 3.

FIG. 4 shows the blanking voltage signals used in the circular electron locus in FIG. 3. More precisely the voltages applied on the blanking system deflector plates in FIG. 3 are given in Equations 2, 3, and 4.

$$V_x(t) = A(t)\cos\left(\left(\frac{2\pi}{T}\right)t\right)$$ Eq. 2

$$V_y(t) = A(t)\sin\left(\left(\frac{2\pi}{T}\right)t\right)$$ Eq. 3

$$A(t) = A_m\left[1 - \exp\left(-\frac{t}{\tau}\right)\right]$$ Eq. 4

Vx(t) and Vy(t) are the blanking deflection voltage signals for the x-axis and y-axis deflector plates in FIG. 3, respectively, and t is the time variable. The $A_m$ is the peak deflection voltage under which the electron beam is able to be deflected from the center 0 to position A. From the center 0 to position A, the deflection experiences a time (e.g., approximately 3τ or approximately 30 ns) reflected in the A(t) of Equation 4, if compared to the period T of from 100 μs to 1,000 μs The time period T in Equations 2 and 3 may be chosen so that the heat on the aperture diaphragm is homogenously distributed rotationally. T may be minimized while providing the desired heat distribution. The time constant τ in Equation 4 may be chosen so that the electron beam can be fast deflected and/or blanked from the center 0 to position A. The time constant τ may be minimized while providing the desired deflection/blanking. The time constant τ may be on the order of approximately 10 nanoseconds so that only a few electrons can reach toward to the target. The time constant τ may be much shorter than the time period T. For example, τ may be 10 ns and T may be 100 ns to 1,000 μs to blank an electron beam.

In an example, the period T in FIG. 4 may be in an order of millisecond or sub-millisecond (i.e., approximately 1,000 to 10,000 revolutions per second). Selection of the period T allows the heat to spread sufficiently and homogeneously.

Figure 5:
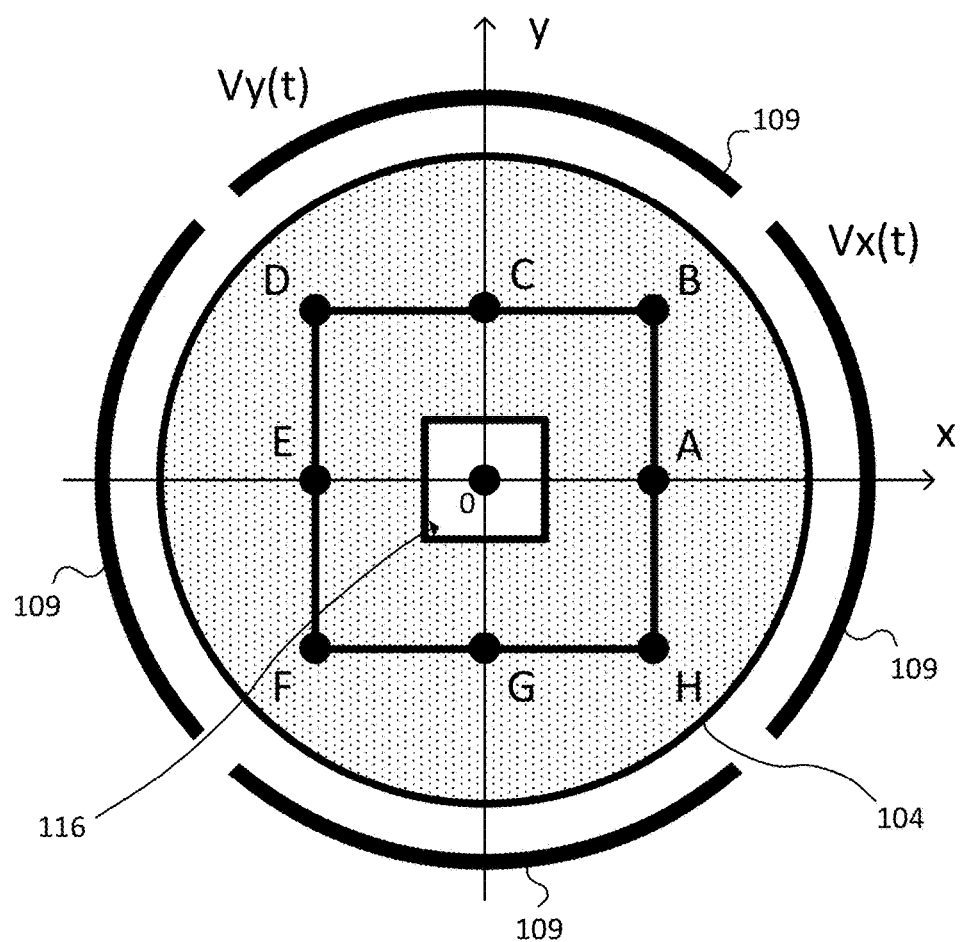
FIG. 5 is a plan view of an aperture diaphragm showing a unipolar blanking method with a square electron locus.
Figure 6:
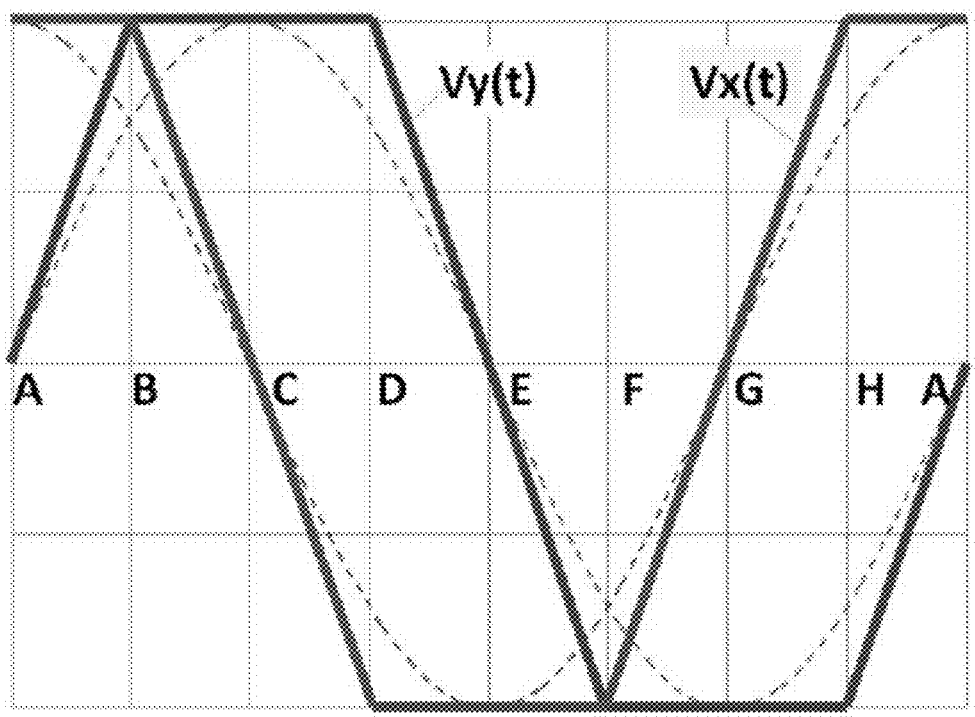
FIG. 6 is a chart showing blanking deflector voltage signals for the square electron locus of FIG. 5.

In a shaped electron beam apparatus, the bore of an aperture 116 may be a square, as shown in FIG. 5. To be consistent with the aperture 116 shape in sinking and spreading the heat symmetrically, a closed square electron locus during the blanking deflection may be used. After the electron beam is deflected from position 0 in the aperture 116 to position A on the aperture diaphragm 104, the electron beam is continuously scanned in a square locus A-B-C-D-E-F-G-H-A, such that the heat dissipation and temperature distribution are rotationally symmetric around the aperture 115. The square pattern may match the shape of the aperture 116. FIG. 5 shows a unipolar blanking method with a square electron locus and FIG. 6 shows the voltage signals applied on the blanking deflector plates for a square electron locus.

A square electron locus for shaped electron beams to spread heat symmetrically, which is consistent with the aperture shape to avoid dimensional errors in stitching patterns of exposures. A square electron locus may cause hot spots at or near the corners. However, these hot spots can be managed while reducing damage to the aperture diaphragm. For example, a symmetric pattern can prevent unbalanced heating of the aperture diaphragm 104 even if hot spots are present. In an instance for a square locus for a square aperture system, the distance between the locus and aperture rim can be kept constant. In another instance for circular locus for a square aperture system, the distance is varied rotationally, and the distance is shortest at the corners of the square aperture.

Figure 7:
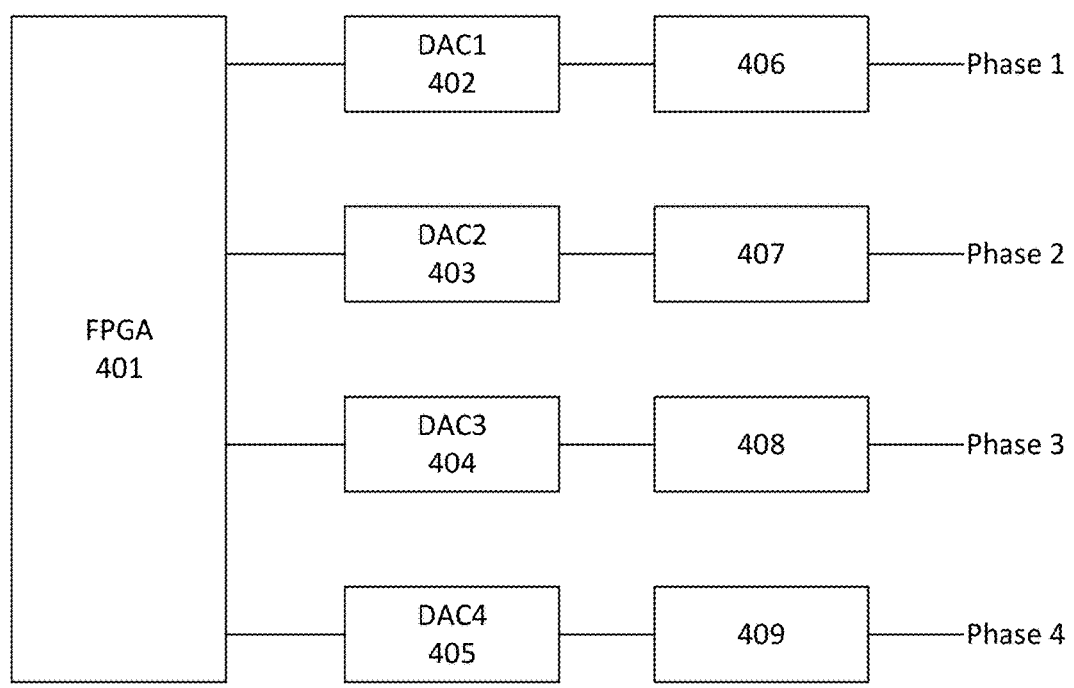
FIG. 7 is a block diagram of functional elements to control unipolar fast blanking in accordance with an embodiment of the present disclosure.

FIG. 7 shows a schematic block diagram of exemplary functional elements to control unipolar blanking with a circular electron locus. As seen in FIG. 7, the elements include four digital-to-analog converters (DAC) 402-405 that control four power supply modules 406-409. The field-programmable gate array (FPGA) 401 can generate DAC data at a rate sufficient to define slow sine waves. The FPGA 401 can generated DAC data to define, for example, four quadrature sine waves. The DAC 402-405 each can produce control voltages of 0 volts to +10 volts. Output voltages Phase 1 through Phase 4 can be, for example, 0 volts to +200 volts. An arbitrary voltage level of +200 volts may be chosen as required. A similar system can be used with a square electron pattern or electron patterns with other shapes.

Figure 8:
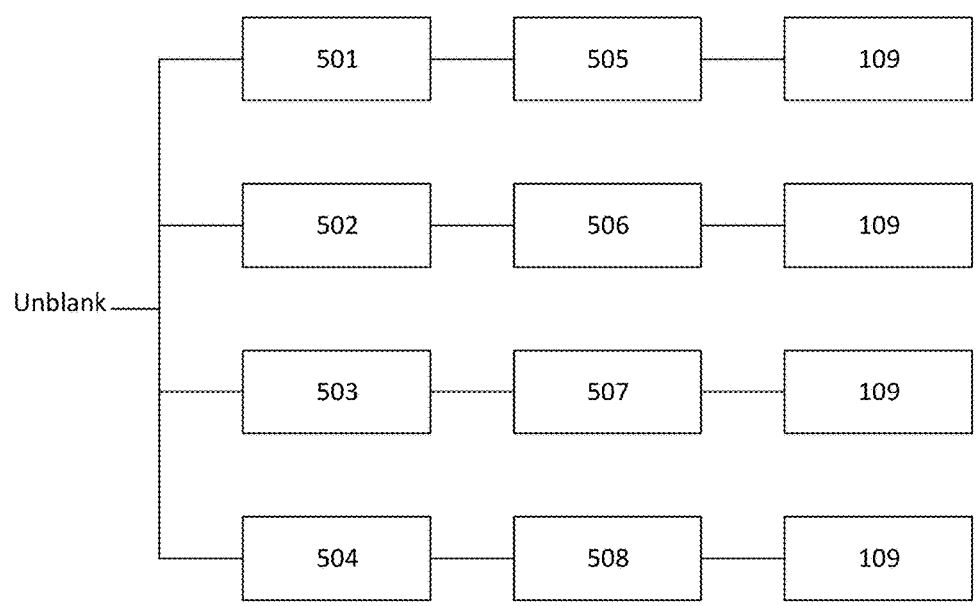
FIG. 8 is a diagram showing blanking system-driving electronics in accordance with an embodiment of the present disclosure.

FIG. 8 is a diagram showing blanking system-driving electronics. The electronics include a four channel switching driver. Four gate drivers 501-504, which may be opto-coupled, are connected to four gates 505-508. The gates 505-508 are connected to the plates in the deflector 109. Each plate in the deflector 109 may be connected to a separate gate. The low output level may always be at ground (e.g., 0 volts). There can be four different high output levels to blank an electron beam. All outputs in the plates of the deflector 109 can switch simultaneously with fastest possible slewing. The outputs may be slow sine waves and can be DAC controlled power supplies. The outputs can be at 0, 90, 180, 270 degrees phase relationship. The unblank signal may toggle at any time and unblank is a logic level control signal. The outputs may pause when unblanked, and resume the slow sine waves when blanked.

Figure 9:
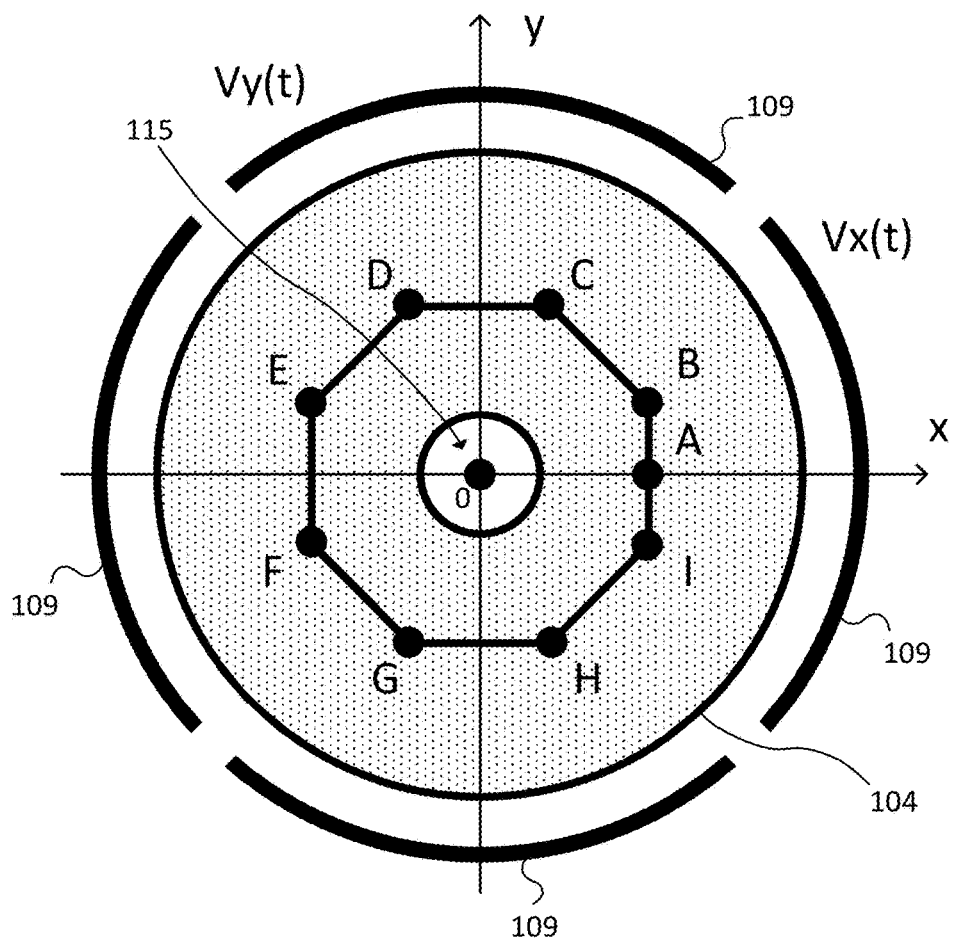
FIG. 9 is a plan view of an aperture diaphragm showing a unipolar blanking method with a polygonal electron locus.
Figure 10:
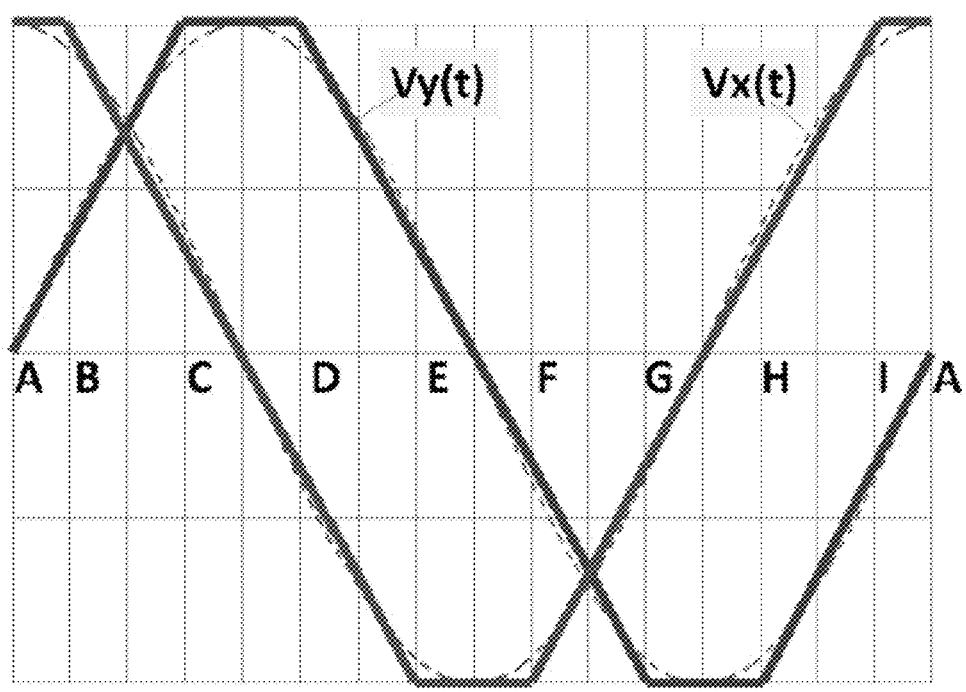
FIG. 10 is a chart showing blanking deflector voltage signals for the polygonal electron locus of FIG. 9.

In accordance with the embodiments disclosed herein, a closed two-dimensional polygonal locus can spread the heat evenly around the aperture 115. The circular electron locus may be a specific polygonal shape by considering the number of the polygon sides to be infinite. Polygons with 4, 6, 8, 12, 16, or more sides are possible. After the electron beam is deflected from position 0 in the aperture 115 to position A on the aperture diaphragm 104, the electron beam is continuously scanned in a polygonal locus A-B-C-D-E-F-G-H-I-A, such that the heat dissipation and temperature distribution are rotationally symmetric around the aperture 115. For instance, FIG. 9 and FIG. 10 show a unipolar blanking method with an octagonal locus, from which one may find that both the electron locus and the voltage signal waveforms are close to circular blanking properties when the number of the polygon sides are relatively large.

A polygonal electron locus, typically an octagonal locus, spreads the heat on the aperture diaphragm in any combination of electron beams. A polygonal electron locus may cause hot spots at or near the corners. However, these hot spots can be managed while reducing damage to the aperture diaphragm. For example, a symmetric pattern can prevent unbalanced heating of the aperture diaphragm 104 even if hot spots are present.

Figure 11:
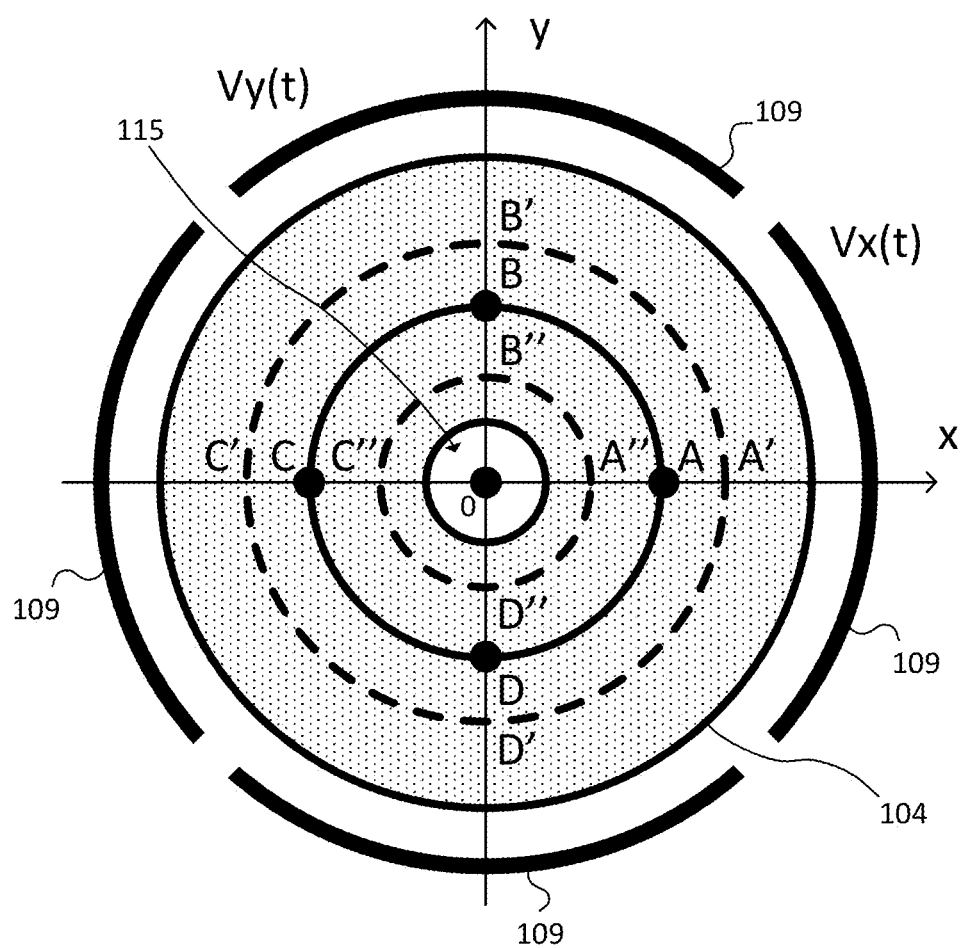
FIG. 11 a plan view of an aperture diaphragm showing a unipolar blanking method with a variable locus.

To spread the narrow heat-ring to wider regions on an aperture diaphragm 104, a locus-variable blanking method may be performed. This is illustrated in FIG. 11. In locus-variable blanking, two square-waveform signals with a time period approximately twice as large as the Vx(t) and Vy(t) time period T in FIG. 4 can be superimposed together. In a locus-variable blanking method, the electron locus goes in a periodic manner of ABCDA, A'B'C'D'A', ABCDA, A"B"C"D"A", ABCDA. As seen in FIG. 11, A"B"C"D"A" is between ABCDA and the aperture 115. A'B'C'D'A' is farther from the aperture 115 than either ABCDA or A"B"C"D"A". Additional patterns at various distances from the aperture 115 besides ABCDA, A'B'C'D'A', and A"B"C"D"A" are possible.

A locus-variable blanking method spreads the heat in wider regions consistent with the concept that the electron power-sinking heat is fundamentally dissipated in a narrowly-distributed ring even though a closed electron locus is applied in blanking and over-heating risks remain local.

While illustrated in a circular pattern in FIG. 11, the locus-variable method can be used with other shapes, such as square or polygonal.

Figure 12:
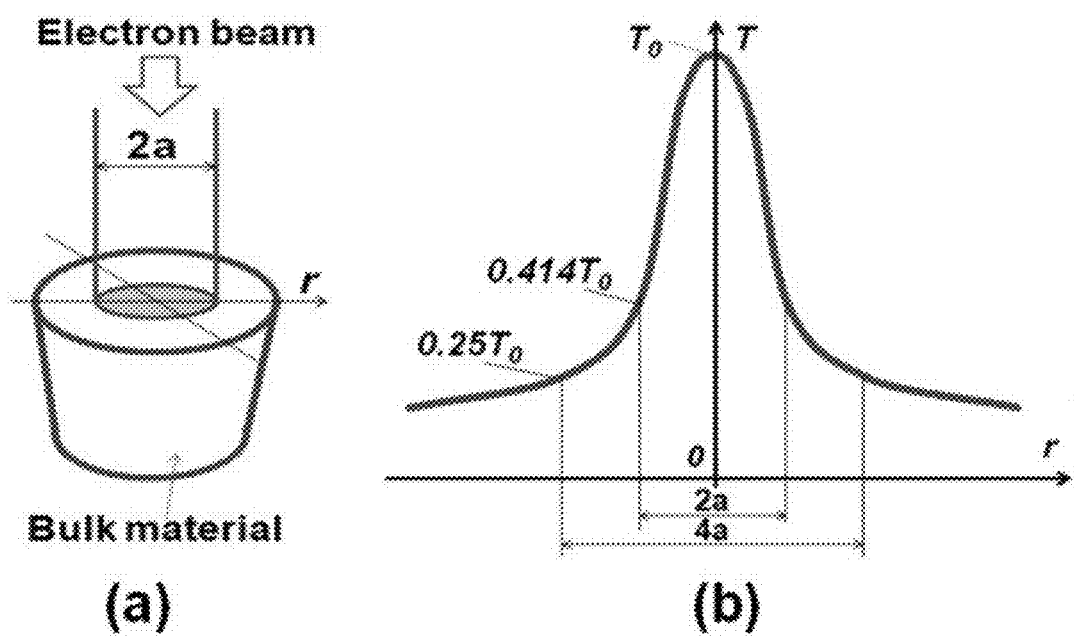
FIG. 12 shows a model of temperature distribution after electron beam power sinks into bulk materials wherein $T_0$ is a saturated temperature and a is the radius of an electron beam.

As described above, the crossover spot size in the aperture plane may be small in a focused electron beam apparatus in FIG. 2. So the high density power can be dissipated in a narrow region of the aperture diaphragm, as shown in FIG. 12. Based on the interactions between electrons and material, the electron beam power-heat transformation is modeled and simulated in FIG. 12. The electron beam sinking temperature T is mainly distributed in a narrow region within 2a or 4a ("a" is the crossover spot radius in submicrons). Even if the electron beam is blanked in a way of circular locus (or square locus), the heat is still distributed in a narrowly circular (or square) ring.

In the temperature model of FIG. 12, in the region out of 4a (i.e., 2X electron beam spot size, in which a is the radius of the electron beam spot) of the electron beam, the saturated temperature drops greater than 75%. Thus, the gap distance between the locus A" and A, or between the locus A and A' may be at least greater than 10a. If the blanked electron beam is focused with high power density, the spot radius is, for example, 75 nm, so the gap distance can be set larger to greater than 100a (i.e., greater than 7.5 μm). The gap distance may be configured to avoid high deflection voltages in some embodiments.

Other patterns for the electron beam that provide the benefits described herein are possible. Thus, the pattern of the electron beam during blanking is not limited to circular, square, or polygonal. For example, mathematical roulette curves (e.g., hypotrochoids, epitrochoids, cycloids, epicycloids, hypocycloids, or trochoids) can be produced.

Figure 13:
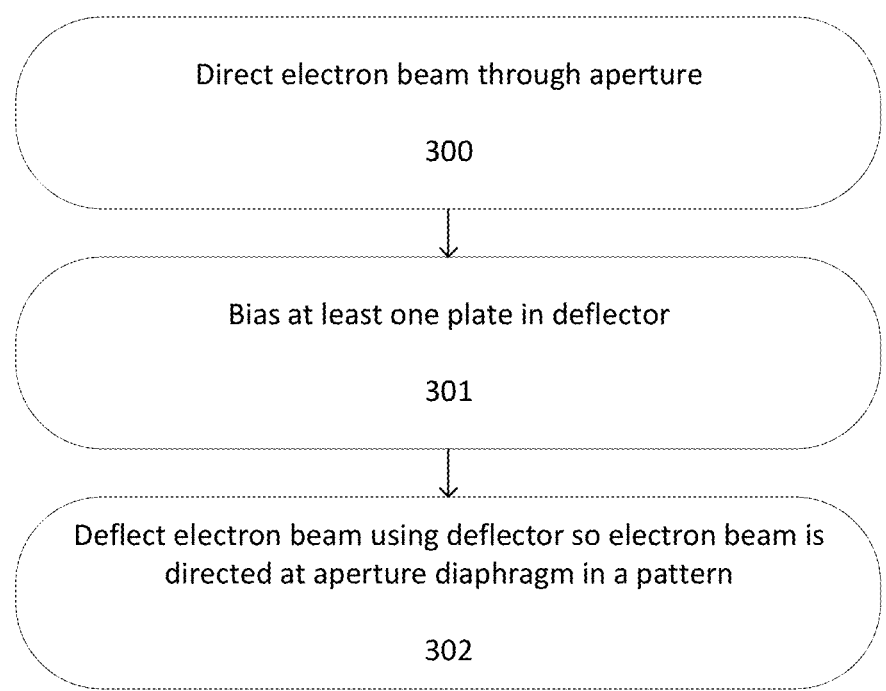
FIG. 13 is a flowchart showing an embodiment in accordance with the present disclosure.

FIG. 13 is a flowchart of an electron beam blanking embodiment. An electron beam is directed 300 through an aperture. At least one plate in a deflector is biased 301. The electron beam is deflected 302 so that the electron beam is directed at an aperture diaphragm in a pattern. The pattern can be around an entirety of the aperture. The pattern may be a circle, square, or polygon. The pattern also can have a variable locus relative to the aperture.

Each of the steps of the method may be performed as described further herein. The methods may also include any other step(s) that can be performed by the electron beam apparatus subsystem and/or computer subsystem(s) or system(s) described herein. The steps are performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron beam apparatus comprising:
   an aperture diaphragm defining an aperture through which an electron beam is projected;
   a lens configured to focus the electron beam toward the aperture;
   a deflector configured to deflect the electron beam on the aperture diaphragm, wherein the deflector includes a plurality of plates; and
   a plurality of power supply modules, wherein the power supply modules are configured to bias the plates such that the electron beam is directed at the aperture diaphragm in a pattern around an entirety of the aperture.

2. The electron beam apparatus of claim 1, wherein the deflector includes four of the plates and the electron beam apparatus includes four of the power supply modules.

3. The electron beam apparatus of claim 1, wherein the deflector includes at least eight of the plates.

4. The electron beam apparatus of claim 1, further comprising a stage configured to hold a wafer in a path of the electron beam.

5. The electron beam apparatus of claim 1, wherein a focus of the electron beam is a distance from a center of the aperture.

6. The electron beam apparatus of claim 1, wherein the lens is a gun lens and wherein the electron beam apparatus further comprises:
a plate defining a beam limiting aperture;
a condenser lens; and
an objective lens.

7. The electron beam apparatus of claim 1, wherein the power supply modules are configured to bias the plates such that the electron beam is directed at the aperture diaphragm and is continuously scanned around the aperture.

8. A method comprising:
directing an electron beam through an aperture, wherein the aperture is defined by an aperture diaphragm, and wherein a deflector including a plurality of plates is disposed around the aperture diaphragm;
biasing at least one of the plates in the deflector; and
deflecting the electron beam using the deflector such that the electron beam is directed at the aperture diaphragm in a pattern around an entirety of the aperture.

9. The method of claim 8, wherein the pattern is a circle.

10. The method of claim 8, wherein the pattern is a square.

11. The method of claim 8, wherein the pattern is a polygon.

12. The method of claim 8, wherein the pattern has a variable locus relative to the aperture, and wherein the pattern is a circle, square, or polygon.

13. An electron beam apparatus comprising:
an aperture diaphragm defining an aperture through which an electron beam is projected;
a lens configured to focus the electron beam toward the aperture;
a deflector configured to deflect the electron beam on the aperture diaphragm, wherein the deflector includes a plurality of plates;
a plurality of power supply modules connected to the plates; and
a controller that is programmed to control a bias to at least one of the plates whereby the electron beam is directed at the aperture diaphragm in a pattern around an entirety of the aperture.

14. The electron beam apparatus of claim 13, wherein the controller is further programmed to control voltage of the power supply modules to bias at least one of the plates.

15. The electron beam apparatus of claim 13, wherein the controller is further programmed to direct the electron beam in a circle, a square, or a polygon.

16. The electron beam apparatus of claim 13, wherein the controller is further programmed to direct the electron beam to have a variable locus relative to the aperture.

17. The electron beam apparatus of claim 13, wherein the deflector includes four of the plates and the electron beam apparatus includes four of the power supply modules.

18. The electron beam apparatus of claim 13, wherein the deflector includes at least eight of the plates.

19. The electron beam apparatus of claim 13, further comprising a stage configured to hold a wafer in a path of the electron beam.

20. The electron beam apparatus of claim 13, wherein the power supply modules are configured to bias the plates such that the electron beam is directed at the aperture diaphragm and is continuously scanned around the aperture.

* * * * *